(12) United States Patent
Morino et al.

(10) Patent No.: US 8,593,812 B2
(45) Date of Patent: Nov. 26, 2013

(54) HEAT EXCHANGER, SEMICONDUCTOR DEVICE, METHOD FOR MANUFACTURING THE HEAT EXCHANGER, AND METHOD FOR MANUFACTURING THE SEMICONDUCTOR DEVICE

(75) Inventors: Masahiro Morino, Okazaki (JP); Yasuji Taketsuna, Okazaki (JP); Eisaku Kakiuchi, Toyota (JP); Yuya Takano, Nishio (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 243 days.

(21) Appl. No.: 13/259,370

(22) PCT Filed: May 11, 2009

(86) PCT No.: PCT/JP2009/058740
§ 371 (c)(1),
(2), (4) Date: Sep. 23, 2011

(87) PCT Pub. No.: WO2010/131317
PCT Pub. Date: Nov. 18, 2010

(65) Prior Publication Data
US 2012/0014066 A1   Jan. 19, 2012

(51) Int. Cl.
*H01L 23/34* (2006.01)
*H05K 7/20* (2006.01)

(52) U.S. Cl.
USPC ............. 361/707; 361/679.46; 361/679.53; 361/679.54; 361/698; 361/699; 361/701; 361/710; 165/80.4; 165/80.5; 165/104.19; 165/104.33; 165/185; 29/890.03; 29/890.044; 29/890.049; 29/890.054; 174/15.1; 174/16.3; 257/714

(58) Field of Classification Search
USPC .......... 361/679.46, 679.47, 679.53, 679.54, 361/689, 688, 798–707, 710–715, 361/717–724; 165/80.2–80.5, 46, 146, 165/104.19, 104.33, 104.34, 185; 174/15.1, 174/16.3, 252; 29/890.033, 890.044, 29/890.049, 890.054, 505, 521, 557, 840; 257/713, 714, 723, 731, 796; 363/137, 363/141, 132, 144–147
See application file for complete search history.

(56) References Cited

U.S. PATENT DOCUMENTS 5,455,458 A * 10/1995 Quon et al. ............. 257/714
5,966,291 A * 10/1999 Baumel et al. .......... 361/707

(Continued)

FOREIGN PATENT DOCUMENTS

CN  101167182 A   4/2008
JP  2002-368170 A  12/2002

(Continued)

OTHER PUBLICATIONS

International Search Report of PCT/JP2009/058740 mailed Jun. 30, 2009.

*Primary Examiner* — Michail V Datskovskiy
(74) *Attorney, Agent, or Firm* — Kenyon & Kenyon LLP

(57) ABSTRACT

Disclosed is a heat exchanger wherein warping (bending) of an intervening member and a frame is suppressed when the intervening member and a wall portion of the frame member having different linear expansion coefficients are welded with each other. A method for manufacturing the heat exchanger, a semiconductor device wherein warping (bending) of an intervening member and a frame is suppressed, and a method for manufacturing the semiconductor device are also disclosed. Specifically disclosed is a heat exchanger wherein a fin member provided with a plurality of fins forming flow channels for a refrigerant is arranged within a frame which forms the outer casing. The frame has a first frame member (a first wall portion) to which insulating plates (intervening members) interposed between the frame and heat-generating bodies (semiconductor elements are welded. The insulating plates (intervening members) have a linear expansion coefficient different from that of the frame. The first frame member is provided with elastically deformable projections (elastically deformable portions) along an arrangement surface of the outer surface on which the insulating plates (intervening members) are arranged.

10 Claims, 12 Drawing Sheets

(56) References Cited

U.S. PATENT DOCUMENTS

| | | | |
|---|---|---|---|
| 6,414,867 B2 * | 7/2002 | Suzuki et al. | 363/141 |
| 6,473,303 B2 * | 10/2002 | Kaufmann | 361/699 |
| 7,800,220 B2 * | 9/2010 | Marz et al. | 257/714 |
| 7,839,641 B2 * | 11/2010 | Baba et al. | 361/711 |
| 7,859,103 B2 * | 12/2010 | Aoki et al. | 257/714 |
| 8,064,234 B2 * | 11/2011 | Tokuyama et al. | 363/141 |
| 2006/0092611 A1 * | 5/2006 | Beihoff et al. | 361/698 |
| 2009/0294105 A1 | 12/2009 | Sundararajan et al. | |
| 2010/0090336 A1 | 4/2010 | Yoshida et al. | |
| 2010/0170662 A1 * | 7/2010 | Baba et al. | 165/104.33 |

FOREIGN PATENT DOCUMENTS

| | | |
|---|---|---|
| JP | 2006-080211 A | 3/2006 |
| JP | 2007-335588 A | 12/2007 |
| JP | 2008-288495 A | 11/2008 |
| JP | 2010-025521 A | 2/2010 |
| JP | 2010-101596 A | 5/2010 |
| WO | 2008084870 A1 | 7/2008 |
| WO | 2008142892 A1 | 11/2008 |

* cited by examiner

HEAT EXCHANGER, SEMICONDUCTOR DEVICE, METHOD FOR MANUFACTURING THE HEAT EXCHANGER, AND METHOD FOR MANUFACTURING THE SEMICONDUCTOR DEVICE

This is a 371 national phase application of PCT/JP2009/058740 filed on May 11, 2009, the entire contents of which are incorporated herein by reference.

TECHNICAL FIELD

The present invention relates to a heat exchanger for cooling a heat generating body such as a semiconductor element by a coolant (cooling medium) flowing in the heat exchanger, a semiconductor device including the heat exchanger and a semiconductor element, and methods for manufacturing them.

BACKGROUND ART

Inverters having a power converting function are used as power sources of hybrid electric vehicles and others. Each of such inverters includes a plurality of semiconductor elements as a switching element. The semiconductor elements of the invertors generate heat in association with power conversion and the like and thus need to be cooled actively.

Here, as one of the heat exchangers for cooling the heat generating bodies such as semiconductor elements, there is known a heat exchanger configured such that a plurality of fins each linearly extending is arranged in parallel in a frame forming an outer casing, thereby forming coolant flow channels (e.g., see Patent Document 1).

RELATED ART DOCUMENTS

Patent Documents
    Patent Document 1: JP 2007-335588A

DISCLOSURE OF THE INVENTION

Problems to be Solved by the Invention

Meanwhile, when the semiconductor elements are to be cooled by the heat exchanger, the heat exchanger should preferably be electrically insulated from the semiconductor elements. For this purpose, an insulator having an electrical insulation property may be interposed between the heat exchanger and the semiconductor elements. This insulator is welded (e.g., brazed) to a wall part of a frame (e.g., an aluminum frame) of the heat exchanger.

However, the insulator and the frame are likely to have different linear expansion coefficients. Accordingly, during welding (e.g., brazing) of the insulator and the wall part of the frame, when the insulator and the wall part of the frame are heated and then cooled, the insulator and the frame may warp (bend) due to a difference in shrinkage rate (linear expansion coefficient) between the insulator and the wall part of the frame. This defect may be caused not only when the insulator is welded to the wall part of the frame but also when an intervening member having a different linear expansion coefficient from the frame, i.e., a member interposed between the wall part of the frame and the heat generating body such as the semiconductor element or the like, is welded to the wall part of the frame.

The present invention has been made in view of the circumstances and has a purpose to provide a heat exchanger and a method for manufacturing the heat exchanger, capable of restraining warping (bending) of an intervening member and a frame which are different in linear expansion coefficient when the intervening member and the wall part of the frame are welded, and a semiconductor device with the intervening member and the frame prevented from warping (bending) and a method for manufacturing the semiconductor device.

Means of Solving the Problems

To achieve the above purpose, one aspect of the invention provides a heat exchanger for cooling a heat generating body, the heat exchanger including a frame forming an outer casing and a fin member having a plurality of fins forming flow channels for a coolant, the fin member being placed in the frame, wherein the frame includes a first wall part to which an intervening member is welded so that the intervening member is interposed between the frame and the heat generating body, the intervening member having a different linear expansion coefficient from a linear expansion coefficient of the frame, and the first wall part of the frame includes an elastically deformable portion configured to be deformable in a direction along a mounting surface of an outer surface of the first wall part, on which mounting surface the intervening member is placed. The elastically deformable portion includes a protrusion protruding into the frame, the protrusion having a U-shaped groove configuration having a U-shaped cross section that opens outward of the frame and linearly extending along the mounting surface in a direction intersecting with a coolant flowing direction.

In the aforementioned heat exchanger, the first wall part of the frame (the wall part to which the intervening member welded so that the intervening member is interposed between the frame and the heat generating body) includes the elastically deformable portion configured to be elastically deformable in the direction along the mounting surface of the outer surface of the first wall part, on which the intervening member is mounted. Therefore, during welding of the intervening member and the first wall part of the frame that are different in linear expansion coefficient, when the intervening member and the first wall part are heated and then cooled, the elastically deformable portion is elastically deformed in the direction along the mounting surface according to a difference in shrinkage rate (linear expansion coefficient) between the first wall part and the intervening member. This can prevent the warping (bending) caused by the different in shrinkage rate (linear expansion coefficient) between the first wall part and the intervening member.

In the present application, "welding" represents a joining method achieved by heating and melting, such as brazing with brazing filler metal, soldering with solder, a joining method by melting a base material (a joining target member), and others.

The heat generating body includes all components that generate heat in use, such as a semiconductor element.

In the aforementioned heat exchanger, the protrusion protruding into the frame constitutes the elastically deformable portion. This protrusion has the U-groove configuration having the U-cross section that opens outward of the frame and linearly extending along the mounting surface of the first wall part. In other words, the protrusion is formed in a U-groove shape having the U-cross section that opens outward of the frame and linearly extending the direction (corresponding to a direction perpendicular to the cross section) along the mounting surface of the first wall part. Such configured protrusion is elastically deformable in the direction along the mounting surface of the first wall part by widening (expanding) and narrowing (contracting) the opening of the U-groove. Therefore, this protrusion is elastically deformed in the direction along the mounting surface of the first wall part, thereby preventing the warping tending to occur due to the difference in shrinkage rate (linear expansion coefficient) between the first wall part and the intervening member.

Meanwhile, according to an investigation of the heat exchanger with the fin member including the fins forming coolant flow channels in the frame constituting the outer casing, a flow velocity distribution of coolant flowing in clearances between the fins has a tendency of the coolant flow velocity being slower as it comes closer to the fins. This is because the coolant is attracted by the fins due to the viscosity of coolant. As a result, in a region near the fins, the flow velocity of coolant is slower than in other regions or the coolant hardly moves. This region is also referred hereinafter to as a boundary layer. When this boundary layer is generated, the fins that undergo heat exchange with only the coolant staying in the boundary layer generated mostly around the fins. Thus, heat exchange with the coolant flowing in other regions than the boundary layer is hardly conducted. Consequently, heat exchange with the coolant flowing inside the heat exchanger is not effectively performed and a high cooling effect could not be achieved.

On the other hand, in the aforementioned heat exchanger, the protrusion protruding into the frame linearly extends in the direction intersecting with the coolant flowing direction. This configuration can cause the coolant flowing in the flow channel to collide with the protrusion and thereby agitate the coolant. Accordingly, the flow of coolant is made turbulent, thus effectively preventing the occurrence of the boundary layer. It is therefore possible to effectively utilize the coolant flowing in the heat exchanger to obtain a high cooling effect.

In the aforementioned heat exchanger, preferably, the protrusion is integrally formed in the wall part by drawing.

In the aforementioned heat exchanger, the protrusion is integrally formed in the first wall part by drawing. Since the protrusion is integrally formed in the first wall part by drawing, the protrusion can be formed easily and at low costs. Thus, the aforementioned heat exchanger is low in cost.

In one of the aforementioned heat exchangers, preferably, the protrusion is provided to extend to inner wall surfaces of both side walls of the frame in the direction intersecting with the coolant flowing direction.

The protrusion protruding into the frame is provided to the inner wall surfaces of both side walls of the frame in the direction intersecting with the coolant flowing direction. This configuration can reliably make the coolant flowing in all the flow channels formed between the fins collide with the protrusions and agitate the coolant. Accordingly, the coolant flowing in all the flow channels can be surely made turbulent, thereby effectively prevent the occurrence of the boundary layer. This configuration can more effectively utilize the coolant flowing in the heat exchanger and provide a higher cooling effect.

In one of the aforementioned heat exchangers, preferably, the protrusion linearly extends in a direction perpendicular to the coolant flowing direction.

Since the protrusion is configured to linearly extend in the direction intersecting with the coolant flowing direction, maximum flowing resistance can be created in the direction perpendicular to the coolant flowing direction. This configuration can generate the turbulent flows most effectively, thereby more reliably enhancing the cooling effect.

In one of the aforementioned heat exchangers, preferably, the protrusion includes protrusions arranged side by side at predetermined intervals in the coolant flowing direction, and the fins are placed between the protrusions located adjacently in the coolant flowing direction.

The fins are arranged between the protrusions adjacently located in the coolant flowing direction and therefore the coolant flowing in the flow channels formed between the fins can be made to appropriately collide with the protrusions and thereby agitated. This configuration can prevent the occurrence of the boundary layer and achieve a high cooling effect.

In the aforementioned heat exchanger, preferably, the heat exchanger is configured to cool a plurality of heat generating bodies arranged side by side in the coolant flowing direction, the first wall part includes a low-heat generation portion on which a heat generating body having a relatively small heat generation amount among the heat generating bodies is placed through the intervening member, and, of the protrusions, a protrusion located upstream in the flow channel from and adjacent to the low-heat generation portion has a shorter protruding height protruding into the frame than a protruding height of other protrusion.

As the protruding height (length) of the protrusions is higher, the flowing resistance of the coolant flowing in the flow channels can be more increased. Thus, the ability of agitating the coolant flowing in the flow channels can be enhanced, and the effect of preventing the occurrence of the boundary layer can be enhanced. However, if the protruding height of the protrusions is too high, pressure loss in the flow channels becomes too large, leading to a great decrease in flow amount of the coolant. This rather decreases the cooling effect.

Meanwhile, when the heat generating bodies (semiconductor elements and others) different in heat generation amount are to be cooled, it is unnecessary to cool all the heat generating bodies uniformly but each heat generating body should be preferably cooled according to respective heat generation amounts. Accordingly, among the heat generating bodies, some heat generating bodies having a relatively small heat amount may be less cooled than other heat generating bodies (the heat generating bodies having a relatively large heat amount).

Therefore, in the aforementioned heat exchanger, among the protrusions, the protrusion located upstream in the flow channel from and adjacent to the low-heat generation portion (the portion of the first wall part, on which portion the heat generating body having a relatively small heat amount among the heat generating bodies is placed with the intervening member interposed) is designed with a shorter protruding height of the frame internally protruding than a protruding height of other protrusion. Since some of the protrusions have such low protruding height, pressure loss in the flow channels can be restrained.

In contrast, the protrusion with low protruding height is inferior in coolant agitating ability as compared with other protrusions. Thus, the flow channels located adjacent to and downstream of the protrusion with low protruding height is poor at preventing the occurrence of the boundary layer. In the aforementioned heat exchanger, in contrast, the protrusion located upstream in the flow channel from and adjacent to the low-heat generation portion is designed with lower protruding height. Specifically, the first wall part includes a low-heat generation portion located adjacent to and downstream of the protrusion with low protruding height (on a downstream side in the flow channels). Accordingly, only the low-heat generation portion has a decreased cooling ability. As above, the cooling ability can be decreased in only the low-heat generation portion and thus each heat generating body can be appropriately cooled according to respective amounts of heat generation.

In the aforementioned heat exchanger, preferably, a flow channel section of the coolant flow channel, the flow channel section including the low-heat generation portion, is deeper in flow channel depth than other flow channel sections are.

In the aforementioned heat exchanger, the coolant flow channel is configured such that the flow channel section defined to include the low-heat generation portion is deeper in flow channel depth (flow channel depth) than other flow channels. The flowing resistance of the coolant flowing in the flow channel can be reduced by the increased depth of the flow channel section including the low-heat generation portion. Accordingly, pressure loss in the flow channel can be further reduced.

In the flow channel section with deeper flow channel depth, the flow velocity becomes lower than in the other flow channel section, resulting in a decrease in cooling ability. In contrast, in the aforementioned heat exchanger, only the flow channel section including the low-heat generation portion is deeper than others. Since only the low-heat generation portion is decreased in cooling ability, each heat generating body can be appropriately cooled according to respective heat generation amounts.

Another aspect of the invention provides a semiconductor device including: one of the aforementioned heat exchangers; a semiconductor element that is the heat generating body; and the intervening member welded to the first wall part of the frame and located between the semiconductor element and the first wall part.

The aforementioned semiconductor device include the heat exchanger mentioned above. Accordingly, the semiconductor device can prevent warping (bending) of the intervening member and the frame.

Another aspect of the invention provides a method for manufacturing a heat exchanger for cooling a heat generating body, the heat exchanger including a frame forming an outer casing and a fin member having a plurality of fins forming flow channels for coolant, the fin member being placed in the frame, the method comprising: a forming step of forming the frame including a first wall part to which an intervening member to be interposed between the frame and the heat generating body is welded; and an assembling step of assembling the heat exchanger by placing the fin member in the frame formed in the forming step, the forming step including drawing to form the protrusion protruding into the frame integral with the first wall part so that the protrusion has a U-shaped groove configuration having a U-shaped cross section that opens outward of the frame and linearly extending along a mounting surface on which the intervening member is to be placed, of the outer surface of the first wall part.

In the above method for manufacturing the heat exchanger, the forming step of forming the frame includes integrally forming the protrusion protruding into the frame in the first wall part (the wall part to which the intervening member is welded) by drawing. As above, the protrusion is integrally formed in the first wall part by drawing and the protrusion can be formed easily and at low costs.

In addition, this protrusion is formed in the U-like groove shape having a U-cross sectional that opens outward of the frame and linearly extending along the mounting surface of the outer surface of the first wall part, on which mounting surface the intervening member is placed. Such configured protrusion has the opening of the U-like groove expands and contracts so that the protrusion be elastically deformed in the direction along the mounting surface of the first wall part. Accordingly, when the intervening member is welded to the first wall part, this protrusion is elastically deformed according to a difference in shrinkage rate (linear expansion coefficient) between the first wall part and the intervening member. It is therefore possible to restrain the warping caused by the difference in shrinkage rate (linear expansion coefficient) between the first wall part and the intervening member.

Another aspect of the invention provides a method for manufacturing a semiconductor device comprising: the heat exchanger manufactured by the aforementioned heat exchanger manufacturing method; a semiconductor element that is the heat generating body; and an intervening member to be interposed between the first wall part of the frame and the semiconductor element, the intervening member having a different linear expansion coefficient from a linear expansion coefficient of the frame, the method comprising: a welding step of placing the intervening member on the mounting surface of the first wall part of the frame and then welding the intervening member to the first wall part.

In the above method for manufacturing the semiconductor device, the welding step includes welding the frame and the intervening member different in linear expansion coefficient to the first wall part of the frame. In a conventional manufacturing method, during welding of an intervening member (an insulator) and a wall part of a frame, when the insulator and the frame wall part are heated and then cooled, the intervening member and the frame may warp (bend) due to a difference in shrinkage rate (linear expansion coefficient) between the intervening member and the frame wall part.

In contrast, the above manufacturing method uses the frame integrally including the first wall part and the protrusion having a U-shaped cross section that opens outward of the frame and a U-groove shape linearly extending in the direction along the mounting surface of the outer surface of the first wall part, on which the intervening member is mounted. Therefore, as mentioned above, when the intervening member is welded to the first wall part, the protrusion is elastically deformed in the direction along the mounting surface of the first wall part according to the difference in shrinkage (linear expansion coefficient) between the first wall part and the intervening member. This can prevent the warping caused by the difference in shrinkage (linear expansion coefficient) between the first wall part and the intervening member.

It is to be noted that a method for welding the intervening member with the first wall part may include brazing using a brazing filler metal, for example.

MODE FOR CARRYING OUT THE INVENTION

EXAMPLE 1

A detailed description in Example 1 of the present invention will now be given referring to the accompanying drawings.

Figure 1:
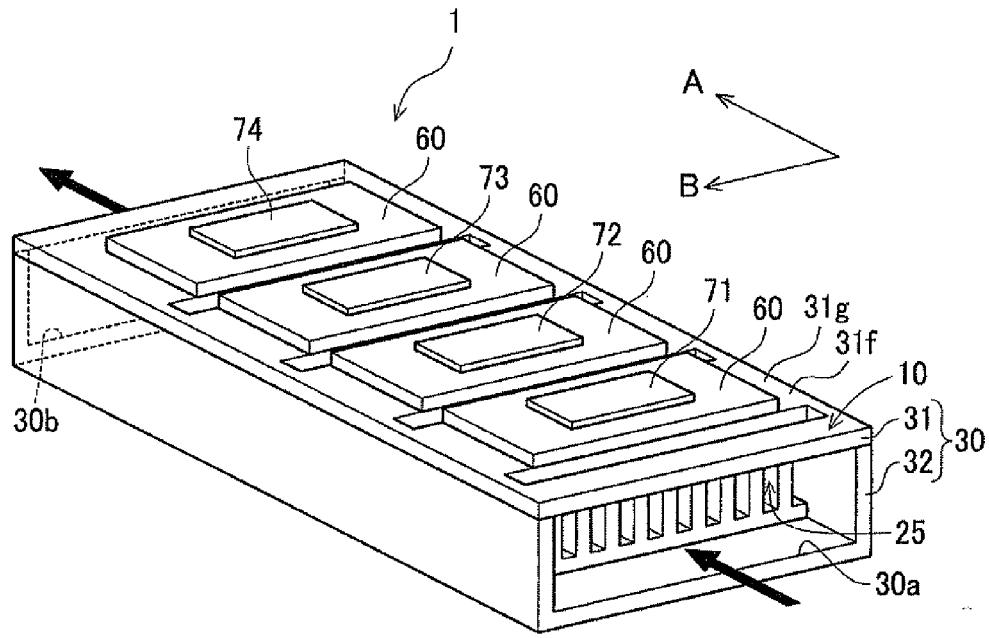
FIG. 1 is a perspective view of a semiconductor device in a first embodiment.

A semiconductor device in Example 1 includes semiconductor elements 71-74 (corresponding to heat generating bodies) and a heat exchanger 10 to cool the semiconductor elements as shown in FIG. 1.

Figure 2:
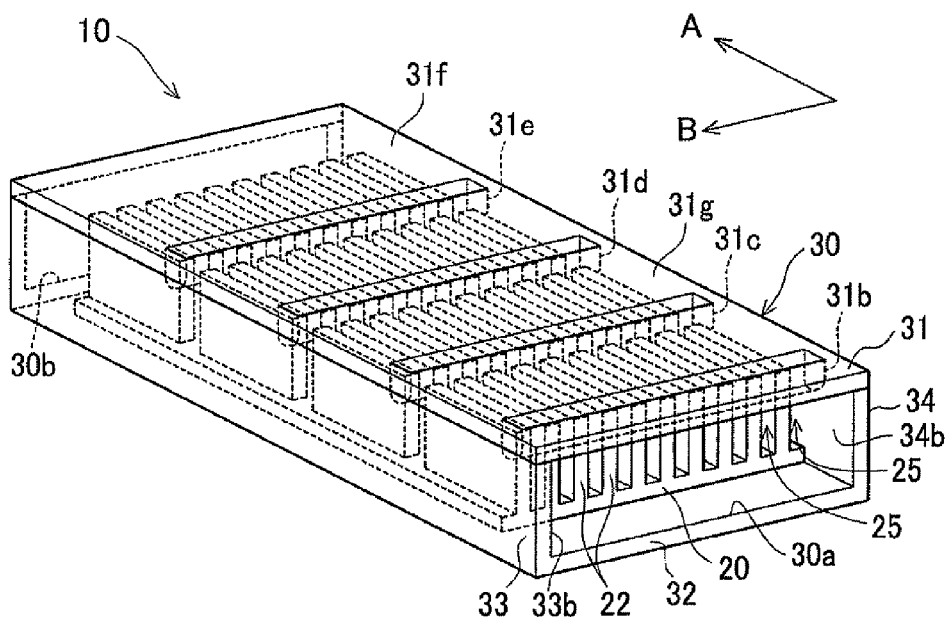
FIG. 2 is a perspective view of a heat exchanger in the first embodiment.

A heat exchanger 10 includes, as shown in FIG. 2, a frame 30 forming an outer casing and a fin member 20 accommodated in the frame 30. These frame 30 and fin member 20 are joined together by brazing.

In FIGS. 1 and 2, a direction A indicates a flowing direction of a coolant (e.g., water) flowing in the heat exchanger 10 and a direction B indicates a direction perpendicular to the direction A.

Figure 3:
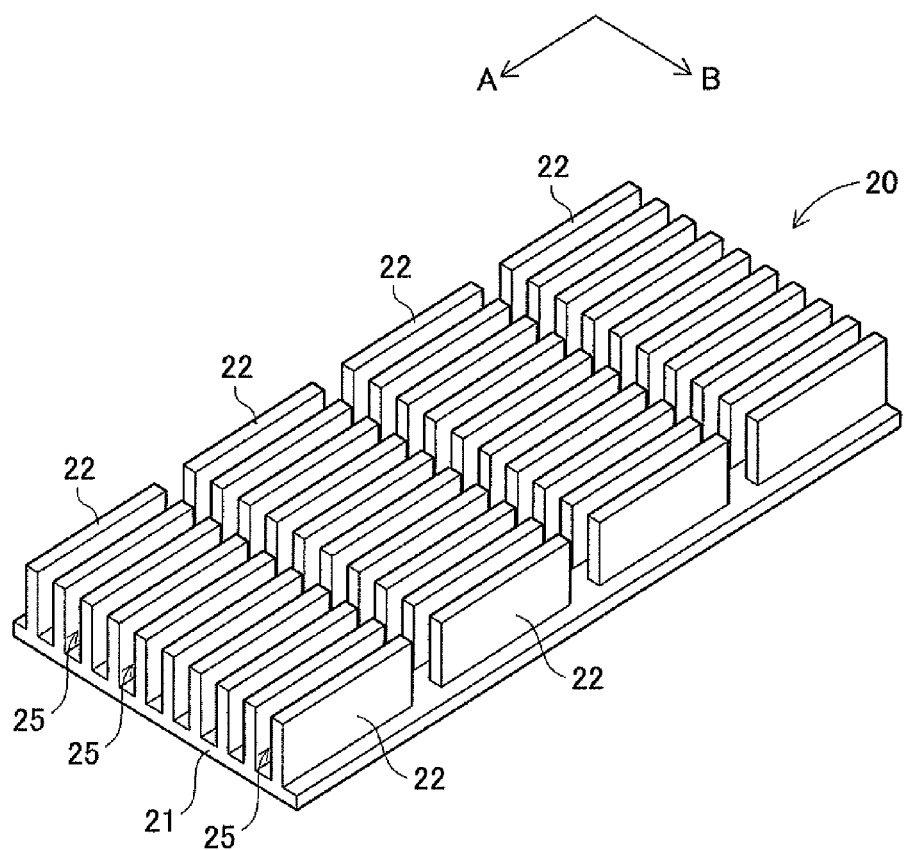
FIG. 3 is a perspective view of a fin member of the heat exchanger in the first embodiment.

The fin member 20 is made of aluminum and includes, as shown in FIG. 3, a rectangular plate-like base 21 and a plurality of fins 22 (forty fins in Example 1) each protruding from one surface of the base 21. Each fin 22 has a rectangular plate-like shape. In a long-side direction (corresponding to the direction A) of the base 21, four fins 22 are arranged in line at fixed intervals. Further, in a short-side direction (corresponding to the direction B) of the base 21, ten fins 22 are arranged in row at fixed intervals. Between each clearance of the fins 22, flow channels 25 for guiding the coolant in the direction A is formed with a predetermined width. This fin member 20 can be integrally made of aluminum by extrusion, for example.

The frame 30 includes a first frame part 31 made of aluminum in a rectangular plate-like shape and a second frame part 32 made of aluminum in a rectangular U-shaped configuration (see FIG. 2). The first frame part 31 and the second frame part 32 are joined to each other by brazing. Thus, the frame 30 has a rectangular tubular shape. This frame 30 includes an inlet 30a at one end in a longitudinal direction (corresponding to the direction A) to allow inflow of the coolant into the frame 30 and an outlet 30b at the other end in the longitudinal direction (corresponding to the direction A) to discharge the coolant.

Figure 4:
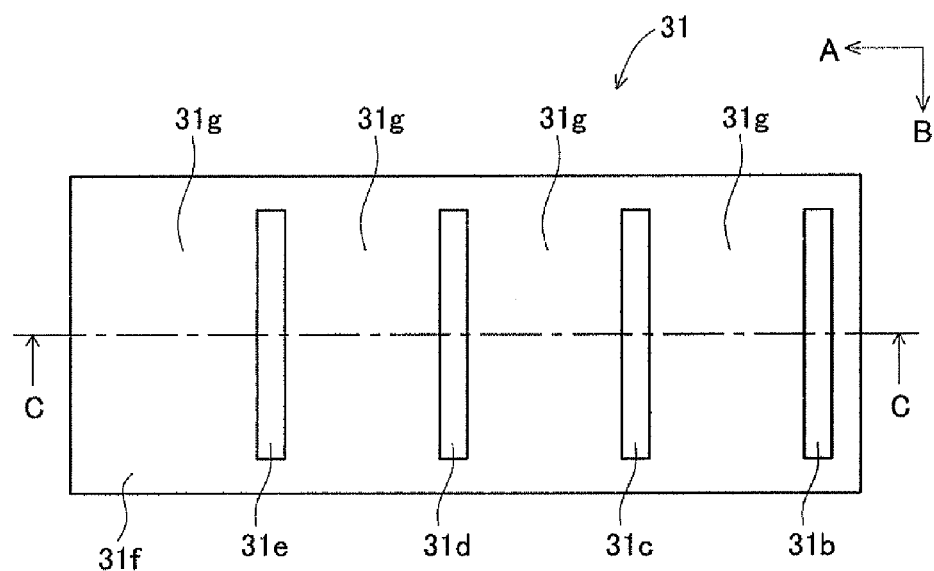
FIG. 4 is a plan view of a first frame part of the heat exchanger in the embodiment.
Figure 5:
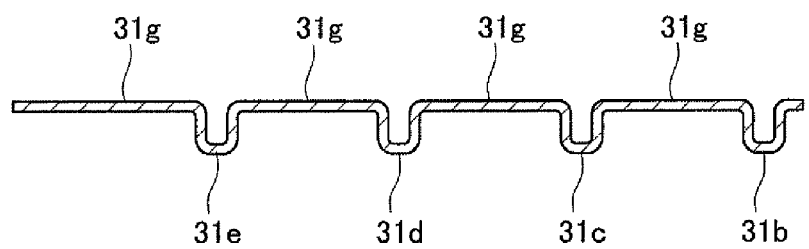
FIG. 5 is a cross sectional view of the first frame part, taken along a line C-C in FIG. 4.
Figure 6:
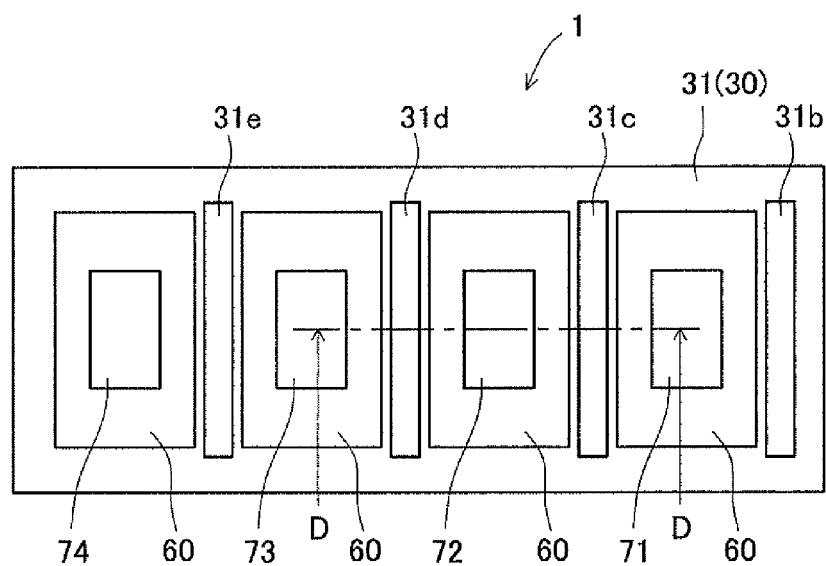
FIG. 6 is a plan view of the semiconductor device in the first embodiment.

The first frame part 31 has an outer surface 31f including flat mounting surfaces 31g in four locations on which insulating plates 60 (corresponding to intervening members) are placed respectively between the frame 30 and the semiconductor elements 71 to 74 (see FIGS. 1, 4, and 5). Each insulating plate 60 is made of an electrically insulating member (e.g., ceramics such as alumina) formed in a rectangular flat plate-like shape. Four insulating plates 60 placed on respective mounting surfaces 31g are arranged in one line at equal intervals in the longitudinal direction (corresponding to the direction A) of the first frame part 31 (see FIGS. 1 and 6). Those insulating plates 60 are joined to the mounting surfaces 31g of the first frame part 31 by brazing. In Example 1, the first frame part 31 corresponds to the first wall part.

Further, the first frame part 31 includes a plurality of protrusions (four protrusions in Example 1) 31b, 31c, 31d, and 31e each protruding into the frame 30 (see FIGS. 2 and 5). Those protrusions 31b to 31e have the same shape. Specifically, as shown in FIGS. 4 and 5, each of the protrusions 31b to 31e has a U-shaped groove configuration having a U-shaped cross section that opens outward (upward in FIG. 5) of the frame 30 and linearly extending in the direction B along the mounting surfaces 31g, i.e., in the direction perpendicular to the coolant flowing direction and in a vertical direction in FIG. 4. Those protrusions 31b to 31e are integrally formed in the first frame part 31 by drawing.

In the first frame part 31, the mounting surfaces 31g are respectively present between the protrusions 31b and 31c, between the protrusions 31c and 31d, between the protrusions 31d and 31e, and in a forward adjacent position to the protrusion 31e in the direction A.

Meanwhile, the insulating plates 60 and the frame 30 (the first frame part 31) have different linear expansion coefficients. To be concrete, for example, each insulating plate 60 made of alumina has a linear expansion coefficient of about $7 \times 10^{-6}/°$ C. On the other hand, the linear expansion coefficient of the frame 30 (the first frame part 31) made of aluminum is about $23 \times 10^{-6}/°$ C. In this case, the linear expansion coefficient of the frame 30 (the first frame part 31) is more than three times as high as the linear expansion coefficient of the insulating plates 60.

For this reason, during conventional welding (e.g., brazing) of an alumina insulating plate and an aluminum frame (the first frame part), when the insulating plate and the first frame part are heated and then cooled, the insulator and the frame are liable to warp (bend) due to a difference in shrinkage rate (linear expansion coefficient) between the insulating plate and the first frame part.

Figure 11:
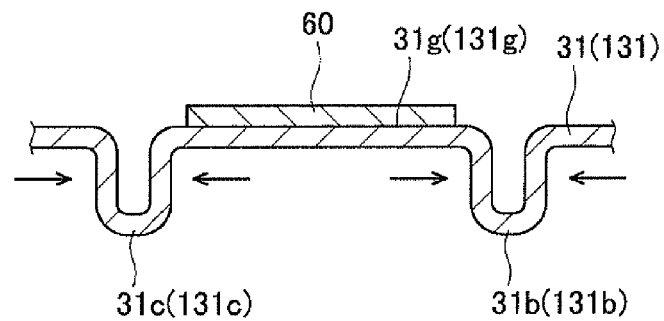
FIG. 11 is an explanatory view showing actions of a protrusion in the welding process in the first embodiment.

In Example 1, on the other hand, the plurality of protrusions (four protrusions in Example 1) 31b, 31c, 31d, and 31e each protruding into the frame 30 are integrally formed with the first frame part 31 as mentioned above (see FIG. 2). Each of those protrusions 31b to 31e has the U-shaped groove configuration having the U-shaped cross section that opens outward of the frame 30 (upward in FIG. 5) and linearly extending in the direction B along the mounting surfaces 31g. Those protrusions 31b to 31e configured as above are elastically deformable in a direction along the mounting surfaces 31g of the first frame part 31 (in a lateral direction in FIGS. 5 and 11) by widening and narrowing the openings of the U-shaped grooves (see FIG. 11).

Consequently, when each insulating plate 60 is welded (brazed in Example 1) to the first frame part 31, the protrusions 31b to 31e are elastically deformed in the direction (in the lateral direction in FIG. 11) along the mounting surfaces 31g of the first frame part 31 according to the difference in shrinkage rate (linear expansion coefficient) between the insulating plates 60 and the first frame part 31. This can prevent the warping (bending) of the insulating plates 60 and the first frame part 31 due to the difference in their shrinkage rate (linear expansion coefficient). In Example 1, the protrusions 31b to 31e correspond to an elastically deformable portion.

Moreover, a heat exchanger including a fin member provided with a plurality of fins thereby forming coolant flow channels in a frame constituting an outer casing was subjected to an investigation to find a distribution of velocity of the coolant flowing between the fins. This investigation showed the tendency that the velocity of the coolant flowing nearer the fins was slower. This is because the coolant is attracted by the fins due to the influence of viscosity of the coolant. Accordingly, near the fins, there occurs a region in which the flowing velocity of the coolant is slower than in other regions or the coolant hardly flows (hereinafter, this region is also referred to as a boundary layer). If such a boundary layer occurs, the fins that collect heat will exchange heat with only the coolant in the boundary layer generated mainly around the fins and will hardly exchange heat with the coolant flowing in other regions than the boundary layer. As a result, heat exchange with the coolant flowing in the heat exchanger can not be effectively conducted and a high cooling effect could not be achieved.

Figure 7:
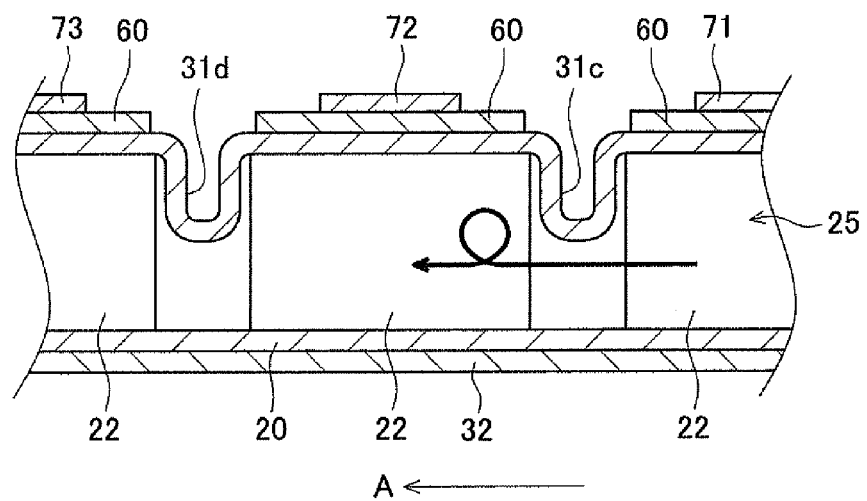
FIG. 7 is a cross sectional view of the semiconductor device in the first embodiment, taken along a line D-D in FIG. 6.

In contrast, the heat exchanger 10 in Example 1 is configured such that the protrusions 31b to 31e each protruding into the frame 30 extend linearly in the direction (direction B) perpendicular to the coolant flowing direction (see FIG. 2). This configuration can make the coolant flowing in the flow channels 25 collide with the protrusions 31b to 31e and agitate the coolant as shown in FIG. 7. Therefore, as shown by an arrow in FIG. 7, the flow of coolant is brought into a turbulent state, thereby effectively preventing the occurrence of the boundary layer. Consequently, the coolant flowing in the heat exchanger 10 can be effectively utilized to provide a high cooling effect.

In the heat exchanger 10 in Example 1, furthermore, the protrusions 31b to 31e are provided to extend to inner wall surfaces 33b and 34b of both side walls 33 and 34 of the second frame part 32 in the direction B (perpendicular to the coolant flowing direction) (see FIG. 2). Thus, the coolant flowing in the flow channels 25 formed between the fins 22 adjacently located in the direction B, between the fins 22 and the side wall 33, and between the fins 22 and the side wall 34 can be made reliably collide with the protrusions 31b to 31e and agitated. Accordingly, the coolant flowing in all the flow channels 25 is surely made turbulent so that the occurrence of the boundary layer is prevented more effectively. Consequently, the coolant flowing in the heat exchanger 10 can be more effectively utilized to achieve a higher cooling effect.

In the heat exchanger 10 in Example 1, furthermore, the protrusions 31b to 31e are arranged side by side (in parallel) and at predetermined intervals in the direction A (the coolant flowing direction) and the fins 22 are placed between adjacent protrusions in the direction A (the coolant flowing direction). Since the fins 22 are placed between the protrusions adjacently located in the coolant flowing direction (the direction A), the coolant flowing in the flow channel 25 formed between the fins 22 can be made to appropriately collide with the protrusions and be agitated. This makes it possible to prevent the occurrence of the boundary layer and achieve a higher cooling effect.

Here, a cooling operation of the heat exchanger 10 of the semiconductor device 1 in Example 1 is explained. The semiconductor elements 71 to 74 generate heat as they operate. Such heat is transferred to the frame 30 (the first frame part 31) through the insulating plates 60 and further to the fins 22 of the fin member 20 accommodated in the frame 30.

The coolant (e.g., water) is continuously introduced into the frame 30 through the inlet 30a as indicated by a thick arrow in FIG. 1. The coolant introduced into the frame 30 is allowed to flow, in the direction A, in the flow channels 25 formed between the fins 22 adjacently located in the direction B and between the fins 22 and the side wall 33 or 34 as mentioned above. The coolant flowing forward in the flow channels 25 collides with the protrusions 31b to 31e and thus becomes agitated as described above. That is, the coolant flows forward in the direction A while making turbulent flows (see FIG. 7). Such a flow can prevent the occurrence of the boundary layer.

Accordingly, the fins 22 of the fin member 22 can make effective heat exchange with the coolant flowing in the flow channels 25. In other words, the heat transferred from the semiconductor elements 71 to 74 to each fin 22 can be dissipated into the coolant flowing in the flow channels 25. The high cooling effect achieved by the heat exchanger 10 is as mentioned above. The coolant having absorbed the heat from the fins 22 as flowing in the flow channels 25 is discharged out of the frame 30 through the outlet 30b. In such a way, the semiconductor elements 71 to 74 that generate heat can be effectively cooled.

A method for manufacturing the semiconductor device 1 in Example 1 will be explained below.

The fin member 20 made of aluminum is first prepared. This fin member 20 can be made of aluminum into a single piece by extrusion for example. To be concrete, a long fin member is formed of aluminum by extrusion to include a rectangular flat plate-like base and a plurality of long fins (ten long fins in Example 1) each protruding from one surface of the base and extending in a longitudinal direction (corresponding to the direction A) of the base. Just after the extrusion but before the long fin member is hardened (in a hot and soft state), a part of the long fin is cut at predetermined intervals in the longitudinal direction (corresponding to the direction A) of the base. Thereafter, the long fin member is cut into a predetermined length, providing a complete fin member 20 including the rectangular flat plate-like base 21 and the plurality of fins (forty fins in Example 1) 22 protruding from one surface of the base 21 (see FIG. 3). The details of this manufacturing method are disclosed in Japanese Patent Application No. 2008-106809 (see FIG. 5).

The first frame part 31 made of aluminum and the second frame part 32 made of aluminum are further prepared.

Figure 8:
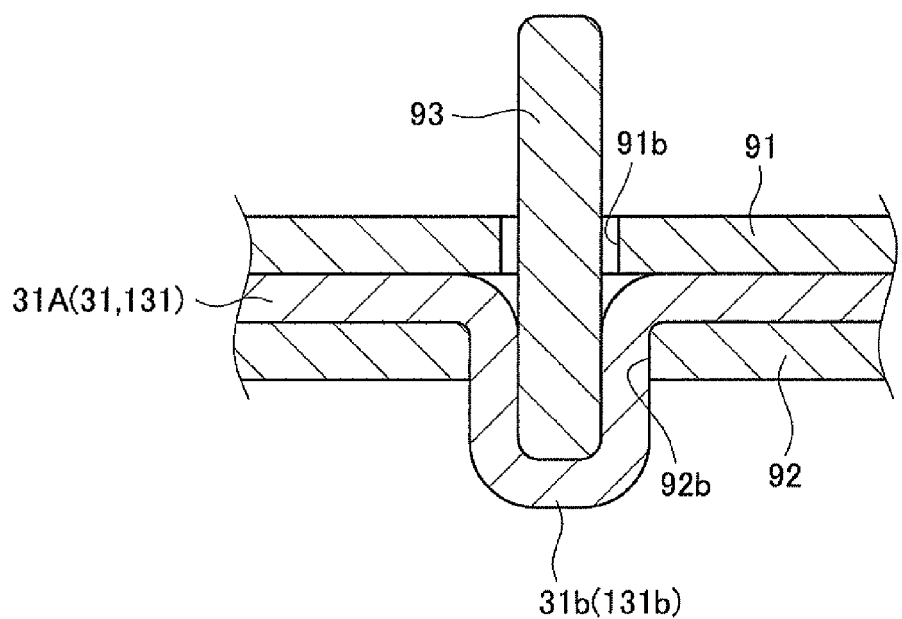
FIG. 8 is an explanatory view showing a forming process (drawing) in the first and second embodiments.

The first frame part 31 is formed as below in a forming process using a first press die 91, a second press die 92, and a drawing die 93 (see FIG. 8). The drawing die 93 has a rectangular flat plate-like shape. A size of the die 93 in its longitudinal direction (a direction perpendicular to a drawing sheet of FIG. 8, corresponding to the direction B) is slightly shorter than the protrusions 31b to 31e in the direction B. The first press die 91 is formed with a through hole 91b in which the drawing die 93 is insertable. The second press die 92 is formed with a through hole 92b having a larger width (in a lateral direction in FIG. 8) than a width of the through hole 91b.

The rectangular aluminum flat plate 31A is first prepared. Successively, this aluminum plate 31A is held between and fixed by the first press die 91 disposed on an upper surface of the aluminum plate 31A and the second press die 92 disposed on a lower surface of the plate 31A as shown in FIG. 8. In this state, the drawing die 93 is moved downward from above the upper surface of the aluminum plate 31A and inserted into the through hole 91b of the first press die 91, gradually pressing down a part of the plate 31A. The part of the plate 31A pressed downward by the drawing die 93 is pushed out of the second press die 92 through the through hole 92b of the second press die 92. Thus, a protrusion 31b is formed. The protrusions 31c to 31e are also formed in the same manner. As above, the protrusions 31b to 31e are made by drawing. Consequently, the first frame part 31 integrally formed with the protrusions 31b to 31e is completed.

The second frame part 32 can be manufactured in such a manner that a rectangular aluminum flat plate is formed into a rectangular U-shape by pressing.

Figure 9:
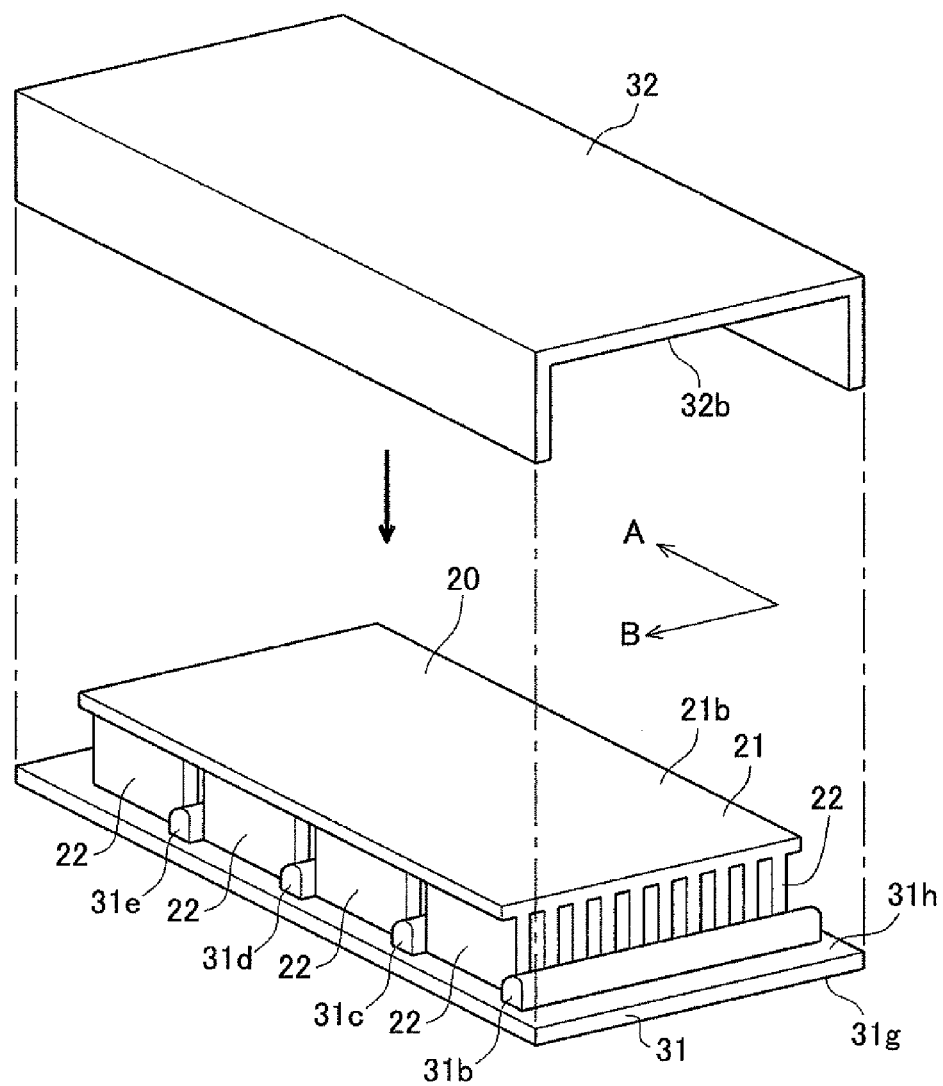
FIG. 9 is an explanatory view showing an assembling process in the first embodiment.

In a subsequent assembling process, the fin member 20 is put on an inner surface 31h of the first frame part 31 as shown in FIG. 9. To be concrete, the fin member 20 is placed on the inner surface 31h of the first frame part 31 so that the protrusions 31c to 31e of the first frame part 31 enter in clearances between the fins 22 of the fin member 20, located adjacently in the direction A. Thereafter, the second frame part 32 is placed on the inner surface 31h of the first frame part 31 to surround the fin member 20. At that time, a back surface 21b of the base 21 of the fin member 20 comes into contact with a bottom surface 32b of the second frame part 32. The inner surface 31h of the first frame part 31 and the bottom surface 32b of the second frame part 32 are applied in advance with brazing filler metal (Melting point: 600° C.).

Thereafter, as mentioned above, an assembly of the fin member 20, first frame part 31, and second frame part 32 is put in an electric furnace (not shown). The temperature of this furnace is then increased to 600° C. to melt the brazing filler metal. Subsequently, the assembly is taken out of the furnace and then cooled to harden the brazing filler metal. The fin member 20, the first frame part 31, and the second frame part 32 can thus be joined by brazing. As above, the heat exchanger 10 in Example 1 can be completed.

Figure 10:
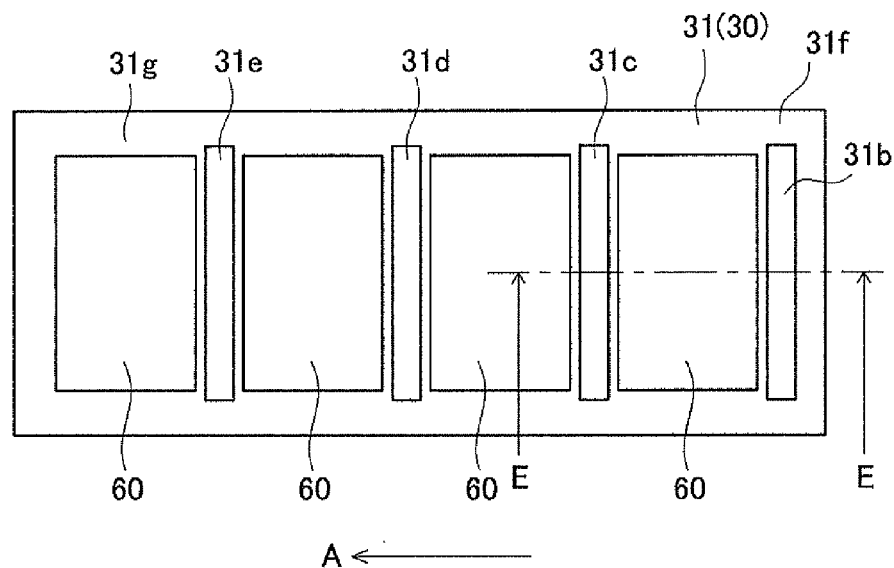
FIG. 10 is an explanatory view showing a welding process in the first embodiment.

In a welding process, four insulating plates 60 are welded (brazed in Example 1) to the first frame part 31 of the heat exchanger 10. To be specific, four insulating plates 60 (e.g., ceramic plates made of alumina) are arranged in a line at equal intervals (by interposing the protrusions 31c to 31e one between each two of the insulating plates 60) in the longitudinal direction (corresponding to the direction A) of the first frame part 31 on the mounting surfaces 31g of the first frame part 31 of the heat exchanger 10 (see FIG. 10). The mounting surfaces 31g of the first frame part 31 are applied with brazing filler metal (Melting point: 550° C.) after the heat exchanger 10 is completed but before the insulating plates 60 are mounted. After they are put in the electric furnace (not shown), the temperature of the furnace is increased up to 550° C. to melt the brazing filler metal. At that time, the brazing filler metal joining the heat exchanger 10 has a melting point of 600° C. and therefore does not melt. The joining state of the heat exchanger 10 can be surely maintained. Accordingly, the heat exchanger 10 provided with the insulating plates 60 is taken out of the electric furnace and cooled to harden the brazing filler metal. As above, four insulating plates 60 can be brazed to the first frame part 31 of the heat exchanger 10.

In addition, the insulating plates 60 and the frame 30 (the first frame part 31) are different in linear expansion coefficient. In the case where the insulating plates 60 made of alumina, for instance, the linear expansion coefficient of the frame 30 (the first frame part 31) made of aluminum is more than three times as high as the linear expansion coefficient of the insulating plates 60. During welding (e.g., brazing) of an alumina insulating plate and an aluminum frame (the first frame part), conventionally, when the insulating plate and the first frame part are heated and then cooled, the insulator and the frame are liable to warp (bend) due to a difference in shrinkage rate (linear expansion coefficient) between the insulating plate and the first frame part.

In Example 1, in contrast, the plurality of protrusions (four protrusions in Example 1) 31b, 31c, 31d, and 31e protruding into the frame 30 are integrally formed with the first frame part 31 (see FIG. 2). Each of those protrusions 31b to 31e has the U-shaped groove configuration having the U-shaped cross section that opens outward (upward in FIG. 5) of the frame 30 and linearly extending in the direction B along the mounting surfaces 31g. By widening and narrowing the openings of the U-shaped grooves, the protrusions 31b to 32e configured as above are elastically deformable in the direction (in the lateral direction in FIGS. 5 and 11) along the mounting surfaces 31g of the first frame part 31 (see FIG. 11).

During welding (brazing in Example 1) of the insulating plates 60 and the first frame part 31, when the insulating plates 60 and the first frame part 31 are heated and then cooled, the protrusions 31b to 31e are elastically deformed (shrinkage) in the direction (in the lateral direction in FIG. 11) along the mounting surfaces 31 of the first frame part 31 according to a difference in shrinkage rate (linear expansion coefficient) between the insulating plates 60 and the first frame part 31. This makes it possible to prevent the insulating plates 60 and the first frame part 31 from warping (bending) due to the difference in shrinkage rate (linear expansion coefficient) between the insulating plates 60 and the first frame part 31. Then, the semiconductor elements 71 to 74 are respectively soldered to the surfaces of the insulating plates 60. The semiconductor device 1 (see FIGS. 1 and 6) in Example 1 is thus completed.

EXAMPLE 2

Example 2 of the present invention will be explained referring to the accompanying drawings.

A semiconductor device 100 (see FIG. 12) in Example 2 is identical to the semiconductor device 1 (see FIG. 1) in Example 1 excepting a heat exchanger alone. Accordingly, only different configurations from those in Example 1 are mainly explained below and the same or identical parts are not explained or are briefly mentioned.

Figure 13:
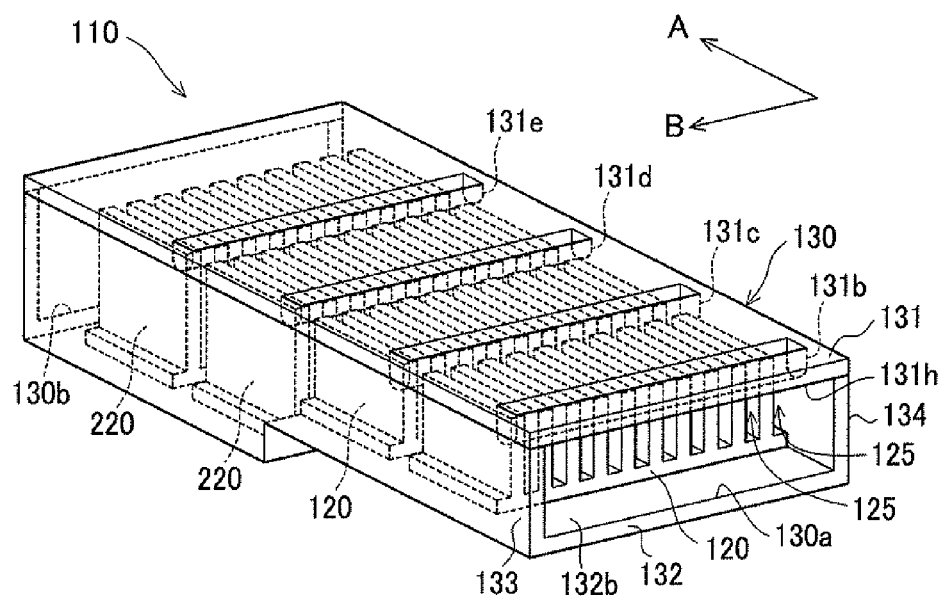
FIG. 13 is a perspective view of a heat exchanger in the second embodiment.

A heat exchanger 110 in Example 2 includes a frame 130 forming an outer casing and fin members 120 and 220 accommodated in the frame 130 as shown in FIG. 13. The frame 130 is joined to the fin members 120 and 220 by brazing. A direction A represents a flowing direction of a coolant (e.g., water) allowed to flow in the heat exchanger 110 and a direction B represents a direction perpendicular to the direction A.

The frame 130 includes a first frame part 131 made of aluminum in a rectangular flat plate-like shape and a second frame part 132 made of aluminum in a rectangular U-shaped cross section (see FIG. 13). The first frame part 131 and the second frame part 132 are joined to each other by brazing.

Figure 16:
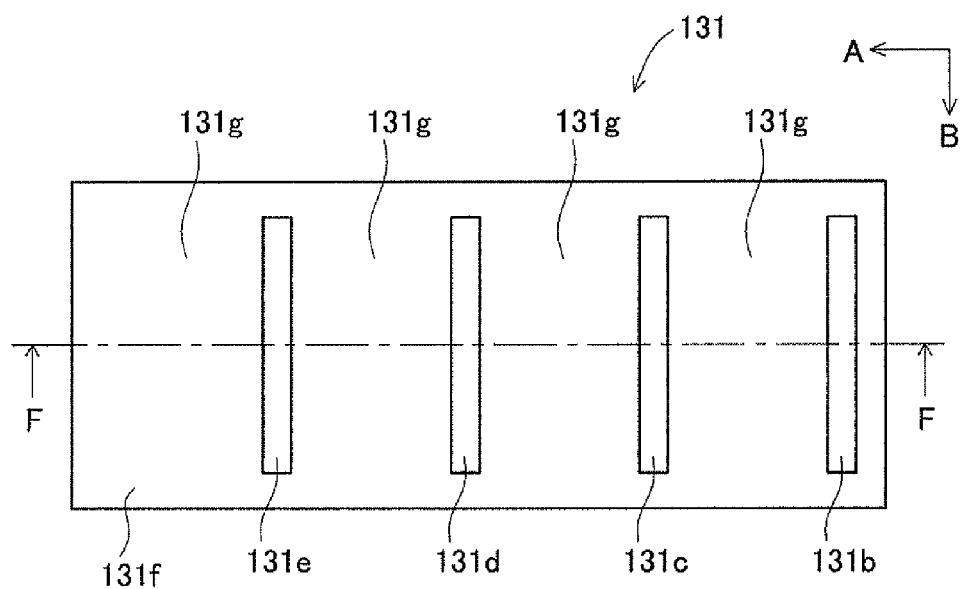
FIG. 16 is a plan view of a first frame part of the heat exchanger in the second embodiment.
Figure 17:
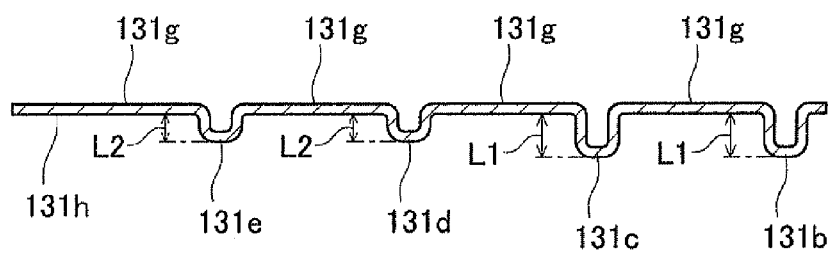
FIG. 17 is a cross sectional view of the first frame part, taken along a line F-F in FIG. 16.

The first frame part 131 includes four protrusions (see FIGS. 16 and 17) as with the first frame part 31 in Example 1. However, two of the four protrusions are different in shape from the protrusions in Example 1. To be concrete, the first frame part 131 includes protrusions 131b and 131c having the same shape of the protrusions 31b and 31c in Example 1 and protrusions 131d and 131e different from the protrusions 31d and 31e in Example 1 only in shorter protruding height. Those protrusions 131b to 131e are integrally formed in the first frame part 131 by drawing as in Example 1. In FIG. 17, the protruding height (length) of each protrusion 131b and 131c is referred to as L1 and the protruding height (length) of each protrusion 131d and 131e is referred to as L2.

Figure 19:
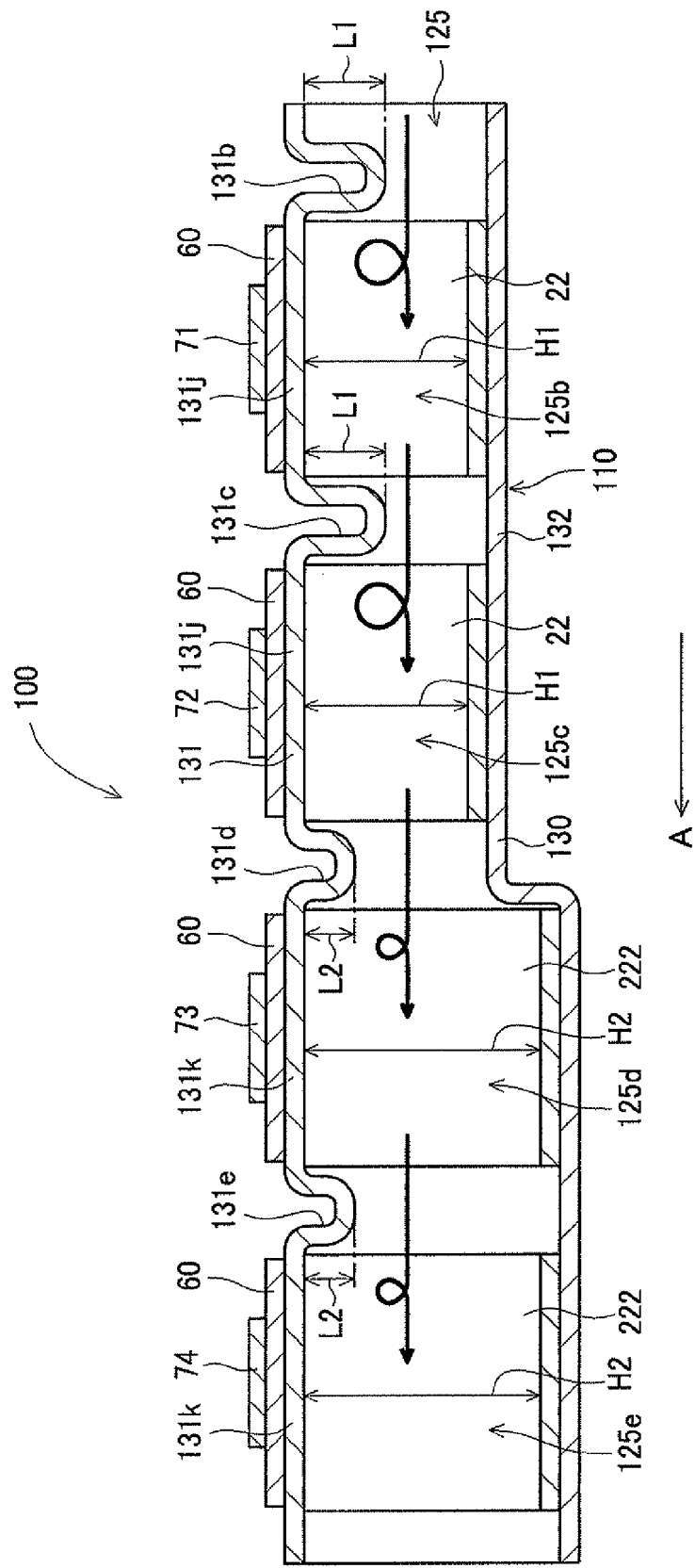
FIG. 19 is a cross sectional view of the semiconductor device in the second embodiment, taken along a line G-G in FIG. 18.

Further, the second frame part 132 is different from the second frame part 32 in Example 1 in that the second frame part 132 is deeper (a size in a vertical direction in FIG. 13) on a downstream side of the flow channels 125 extending in the direction A (in the coolant flowing direction) than the second frame part 32. In other words, a bottom surface 132b of the second frame part 132 is stepped downward in the direction A. Accordingly, the flow channel depth (the size in the vertical direction in FIG. 13) of the flow channels 125 extending in the direction A (the coolant flowing direction) is deeper on the downstream side than on the upstream side. Specifically, as shown in FIG. 19, each flow channel 125 has a depth H1 on the upstream side and a depth H2 on the downstream side so that the depth H2 is larger than the depth H1.

The flow channels 125 are formed between the fins 22 adjacent in the direction B, between the fins 22 and the side wall 133, between the fins 22 and the side wall 134, between fins 222 adjacent in the direction B, between the fins 222 and the side wall 133, and between the fins 222 and the side 134.

Figure 14:
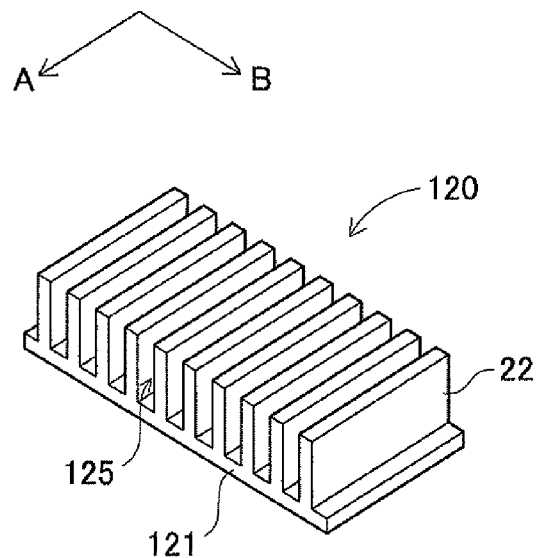
FIG. 14 is a perspective view of a fin member of the heat exchanger in the second embodiment.

The fin members 120 (see FIG. 14) are members each corresponding to one piece obtained by dividing the fin member 20 in Example 1 into four in the direction A. To be specific, each fin member 120 is made of aluminum including a rectangular flat plate-like base 121 and a plurality of fins (ten fins in Example 2) 22 protruding from one surface of the base 121. These fin members 120 are placed one each between the protrusions 131b and 131c of the first frame part 131 and between the protrusions 131c and 131d (see FIG. 13). The fin members 120 are thus placed on the upstream side of the flow channels 125. In addition, the flow channels 125 each having a predetermined width are formed between the fins 22 to introduce the coolant in the direction A. Each fin member 120 can be formed of an integral component by known extrusion for example.

Figure 15:
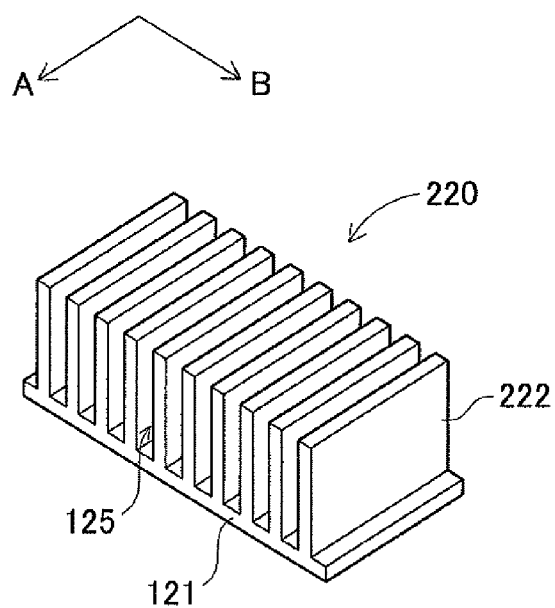
FIG. 15 is a perspective view of another fin member of the heat exchanger in the second embodiment.

Each fin member 220 is made of aluminum and includes a rectangular flat plate-like base 121 and a plurality of fins (ten fins in Example 2) 222 protruding from one surface of the base 121 as shown in FIG. 15. These fin members 220 are placed one each between the protrusions 131d and 131e of the first frame part 131 and in a forward adjacent position to the protrusion 131e in the direction A (see FIG. 13). Accordingly, the fin members 220 are located on a downstream side of the flow channels 125. Each fin member 220 is different only in fin protruding height (a size in a vertical direction in FIG. 15) from the fin members 120. Specifically, each fin member 220 is designed such that the fins 222 have a protruding height higher than the protruding height of the fins 22 of each fin member 120 by a length (H2-H1) determined by subtracting the depth H1 of the flow channels 125 on the upstream side from the depth H2 on the downstream side. In addition, the flow channels 125 each having a predetermined width are formed between the fins 222 to introduce the coolant in the direction A. Each fin member 120 can be formed of an integral component by known extrusion for example.

Moreover, as the protruding height of the protrusions of the first frame part is higher, the flow resistance of coolant flowing in the flow channels can be made higher. Thus, the protrusions can provide the higher ability to agitate the coolant flowing in the flow channels, thereby enhancing the effect of preventing the occurrence of the boundary layer. However, if the protruding height of the protrusions is too high, pressure loss in the flow channels becomes too larger. This greatly lowers the flow amount of coolant and thus results in a low cooling effect.

When a plurality of semiconductor elements having different heat generation amounts are to be cooled, it is unnecessary to cool all the heat generating bodies uniformly and the semiconductor elements have only to be cooled according to respective heat generation amounts. Consequently, of the semiconductor elements, the semiconductor element(s) having a relatively low heat generation amount may be cooled with a lower degree of cooling than the other semiconductor element(s) is.

In the semiconductor device 100 in Example 2, among the semiconductor elements 71 to 74, the semiconductor elements 73 and 74 have lower heat generation amounts than the semiconductor elements 71 and 72 have. In the heat exchanger 110 in Example 2, therefore, the protruding height L2 of the protrusions 131d and 131e arranged respectively upstream (a right side in FIG. 19) in the flow channels 125 from and adjacent to low-heat generation portions 131k is shorter than the protruding height L1 of the other protrusions 131b and 131c. Here, the low-heat generation portions 131k are portions of the first frame part 131 and on which the semiconductor elements 73 and 74 having relatively low heat generation amounts are placed through the insulating plates 60. Since the protruding height of the selected protrusions 131d and 131e is designed to be shorter, pressure loss in the flow channels 125 can be reduced.

On the other hand, the protrusions 131d and 131e with shorter protruding height are lower in coolant agitating ability than the other protrusions 131b and 131c. In the flow channel sections 125d and 125e arranged respectively downstream (a left side in FIG. 19) in the flow channels 125 from and adjacent to the protrusions 131d and 131e with shorter protruding height, the effect of preventing the occurrence of the boundary layer decreases. In Example 2, however, the protrusions 131d and 131e arranged respectively upstream (the right side in FIG. 19) in the flow channel 125 from and adjacent to the low-heat generation portions 131k are designed with shorter protruding height. In other words, the first frame part 131 is configured to include portions arranged downstream (the left side in FIG. 19) in the flow channel 125 from and adjacent to the protrusions 131d and 131e with shorter protruding height as the low-heat generation portions 131k. Accordingly, only the low-heat generation portions 131k have the low effect of preventing the occurrence of the boundary layer and the low cooling ability. In this way, the cooling ability is low in only the low-heat generation portions 131k, so that the semiconductor elements 71 to 74 can be cooled appropriately according to respective heat generation amounts.

In the heat exchanger 110 in Example 2, as shown in FIG. 19, the flow channel sections 125d and 125e including the low-heat generation portions 131k in each coolant flow channel 125 are designed with a deeper depth than the depth of other flow channel sections (the flow channel sections 125b and 125c including high-heat generation portions 131j). The flow resistance of coolant flowing in the flow channels 125 can be reduced by the larger depth of the flow channel sections 125d and 125e. the pressure loss in the flow channels 125 can be further reduced. In FIG. 19, the depth of each flow channel section 125b and 125c is referred to as H1 and the depth of each flow channel section 125d and 125e is referred to as H2. The high-heat generation portions 131j are portions of the first frame part 131 and on which the semiconductor elements 71 and 72 having relatively large heat generation amounts are placed through the insulating plates 60.

Meanwhile, in a flow channel section with deeper depth, the flow velocity tends to become faster than in other flow channel section, resulting in a lower cooling ability. In the heat exchanger 110 in Example 2, however, only the flow channel sections 125d and 125e including the low-heat generation portions 131k are designed with deeper depth. Since the cooling ability is low in only the low-heat generation portions 131k, the semiconductor elements 71 to 74 can be cooled appropriately according to respective heat generation amounts.

Here, a cooling operation of the heat exchanger 110 of the semiconductor device 100 in Example 2 is explained. The semiconductor elements 71 to 74 generate heat as they operate. Such heat is transferred to the frame 130 (the first frame part 131) through the insulating plates 60 and further to the fins 22 of the fin members 120 and the fins 222 of the fin members 220 accommodated in the frame 130.

Figure 12:
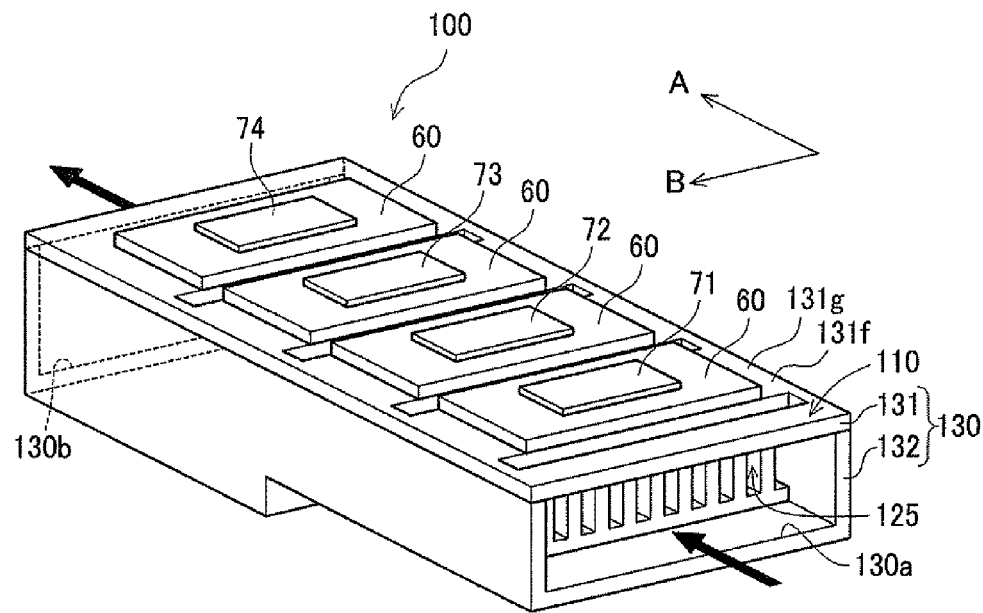
FIG. 12 is a perspective view of a semiconductor device in the second embodiment.

The coolant (e.g., water) is continuously introduced into the frame 130 through the inlet 130a as indicated by a thick arrow in FIG. 12. The coolant introduced into the frame 130 is allowed to flow in the flow channels 125 in the direction A. The coolant flowing in the flow channels 125 collide with the protrusions 131b to 131e and thus becomes agitated, so that the coolant flows forwards in the direction A while making turbulent flows (see FIG. 19). Such a flow can prevent the occurrence of the boundary layer.

Accordingly, the fins 22 of the fin members 120 and the fins 222 of the fin members 220 can make effective heat exchange with the coolant flowing in the flow channels 125. Specifically, the heat transferred from the semiconductor elements 71 to 74 to the fins 22 and 222 can be efficiently dissipated into the coolant flowing in the flow channels 125. The coolant having absorbed the heat from the fins 22 and 222 while flowing in the flow channels 125 is discharged out of the frame 130 through the outlet 130b. In such a way, the semiconductor elements 71 to 74 that generate heat can be effectively cooled.

In addition, the heat exchanger 110 in Example 2 is configured such that the protrusions 131d and 131e are of shorter protruding height and the flow channel sections 125d and 125e are of deeper depth as mentioned above. This configuration can effectively reduce the pressure loss in the flow channels 125. It is therefore possible to restrain a decrease in flow amount of coolant, thereby enabling appropriate cooling of the semiconductor elements 71 to 74 that generate heat.

A method for manufacturing semiconductor device 100 in Example 2 will be explained below.

The fin members 120 and 220 made of aluminum are first prepared two by two. Each fin member 120 and 220 can be made of aluminum into a single piece by extrusion for example.

Further, the first frame part 131 made of aluminum and the second frame part 132 made of aluminum are also prepared. The first frame part 131 is fabricated in a forming process using the first press die 91, the second press die 92, and the drawing die 93 (see FIG. 8) in the same manner as in Example 1. However, in the drawing work for the protrusions 131d and 131e, a downward moving amount (a drawing amount) of the drawing die 93 is set smaller than in the drawing work for the protrusions 131b and 131c. The second frame part 132 can be manufactured from a rectangular aluminum flat plate by pressing.

In an assembling process, subsequently, the fin members 120 and 220, the first frame part 131, and the second frame part 132 are assembled together as shown in FIG. 13 (constituting an assembly). An inner surface 131h of the first frame part 131 and a bottom surface 132b of the second frame part 132 are applied in advance with brazing filler metal (Melting point: 600° C.). Thereafter, as in Example 1, the assembly is put in the electric furnace (not shown). The brazing filler metal is melted therein and then the assembly is cooled to harden the brazing filler metal. Thus, the fin members 120 and 220, the first frame part 131, and the second frame part 132 are joined to each other by brazing. In such a way, the heat exchanger 110 in Example 2 is completed.

In a welding process, four insulating plates 60 are brazed to the first frame part 131 of the heat exchanger 110 according to the same procedures as in Example 1. Specifically, the four insulating plates 60 are first placed one on each of the mounting surfaces 131g (see FIGS. 16 and 17) of the first frame part 131. It is to be noted that the mounting surfaces 131g of the first frame part 131 are applied with brazing filler metal (Melting point: 550° C.) after the heat exchanger 110 is completed but before the insulating plates 60 are mounted. Subsequently, they are put in the electric furnace (not shown) and then the temperature of the furnace is increased to 550° C. to melt the brazing filler metal. At that time, the brazing filler metal joining the heat exchanger 110 has a melting point of 600° C. and therefore does not melt. Accordingly, the joining state of the heat exchanger 110 can be surely maintained. After that, the heat exchanger 110 with the insulating plates 60 is taken out of the furnace and cooled, thus hardening the brazing filler metal. In such a way, the insulating plates 60 are brazed to the first frame part 131 of the heat exchanger 110.

Meanwhile, the insulating plates 60 and the frame 130 (the first frame part 131) are different in linear expansion coefficient. In the case where the alumina insulating plates 60 are used, for example, the linear expansion coefficient of the aluminum frame 130 (first frame part 131) is more than three times as high as the linear expansion coefficient of the insulating plates 60. Therefore, during welding (e.g., brazing) of an alumina insulating plate and an aluminum frame (first frame part), conventionally, when the insulating plate and the first frame part are heated and then cooled, the insulating plate and the frame are liable to warp (bend) due to a difference in shrinkage rate (linear expansion coefficient) between them.

In Example 2, in contrast, a plurality of protrusions (four protrusions in Example 2) 131b, 131c, 131d, and 131e protruding into the frame 130 are integrally formed in the first frame part 131 as mentioned above (see FIGS. 13 and 17). Each of those protrusions 131b to 131e has a U-shaped groove configuration having a U-shaped cross section that opens outward (upward in FIG. 17) of the frame 130 and linearly extending in the direction B along the mounting surfaces 131g. Those protrusions 131b to 131e configured as above are elastically deformable in the direction along the mounting surfaces 131g of the first frame part 131 (in a lateral direction in FIGS. 11 and 17) by widening and narrowing the openings of the U-shaped grooves (see FIG. 11).

Consequently, during welding (brazing in Example 2) of each insulating plate 60 to the first frame part 131, when the insulating plates 60 and the first frame part 131 are heated and then cooled, the protrusions 131b to 131e are elastically deformed in the direction (in the lateral direction in FIG. 11) along the mounting surfaces 131g of the first frame part 131 according to the difference in shrinkage rate (linear expansion coefficient) between the insulating plates 60 and the first frame part 131. This can prevent the insulating plates 60 and the first frame part 131 from warping (bending) due to the difference in their shrinkage rate (linear expansion coefficient).

Figure 18:
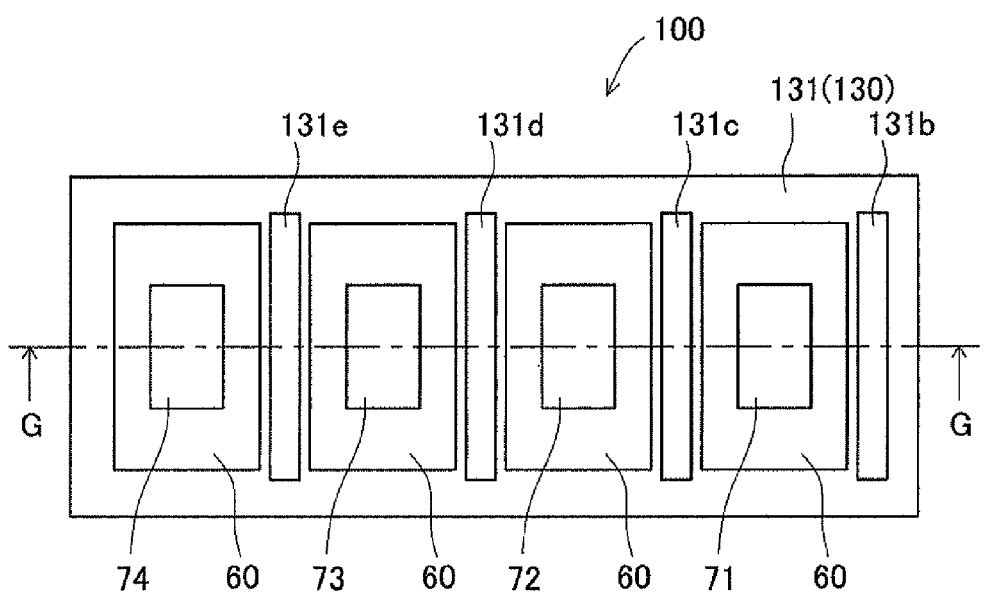
FIG. 18 is a plan view of the semiconductor device in the second embodiment.

Thereafter, the semiconductor elements 71 to 74 are soldered respectively to the surfaces of the insulating plates 60. The semiconductor device 100 in Example 1 is thus completed (see FIGS. 12 and 18).

The present invention is explained above in Examples 1 and 2 but is not limited thereto. The present invention may be embodied in other specific forms without departing from the essential characteristics thereof.

For instance, in Example 1, the fin member 20, the first frame part 31, and the second frame part 32 are first joined to each other by brazing to complete the heat exchanger 10, and subsequently the insulating plates 60 are brazed to the first frame part 31 of the heat exchanger 10. As an alternative, the fin member 20, the first frame part 31, the second frame part 32, and the insulating plates 60 may be brazed to each other at the same time. In this case, as the brazing filler metal, metals having the same melting point (e.g., 600° C.) may be used. According this method, at the same time when the heat exchanger 10 is completed, the insulating plates 60 are brazed to the first frame part 31 of the heat exchanger 10. The same applies to Example 2.

DESCRIPTION OF THE REFERENCE SIGNS

1, 100 Semiconductor device
10, 110 Heat exchanger
20, 120, 220 Fin member
22, 222 Fin
25, 125 Flow channel
30, 130 Frame
31, 131 First frame part (First wall part)
31*b*, 31*c*, 31*d*, 31*e*, 131*b*, 131*c*, 131*d*, 131*e* Protrusion (Elastically deformable portion)
31*f*, 131*f* Outer surface of First frame part (First wall part)
31*g*, 131*g* Mounting surface
32, 132 Second frame part
60 Insulating plate (Intervening member)
71, 72, 73, 74 Semiconductor device (Heat generating body)
125*d*, 125*e* Flow channel section including a low-heat generation portion
131*k* Low-heat generation portion
A Coolant flowing direction
B Direction perpendicular to (intersecting with) coolant flowing direction

What is claimed is:

1. A heat exchanger for cooling a heat generating body, the heat exchanger including a frame forming an outer casing and a fin member having a plurality of fins forming flow channels for a coolant, the fin member being placed in the frame, wherein
    the frame includes a first wall part to which an intervening member is welded so that the intervening member is interposed between the frame and the heat generating body, the intervening member having a different linear expansion coefficient from a linear expansion coefficient of the frame,
    the first wall part of the frame includes an elastically deformable portion configured to be deformable in a direction along a mounting surface of an outer surface of the first wall part, on which mounting surface the intervening member is placed, and
    the elastically deformable portion includes a protrusion protruding into the frame, the protrusion having a U-shaped groove configuration having a U-shaped cross section that opens outward of the frame and linearly extending along the mounting surface in a direction intersecting with a coolant flowing direction.

2. The heat exchanger according to claim 1, wherein the protrusion is integrally formed in the wall part by drawing.

3. The heat exchanger according to claim 1, wherein the protrusion is provided to extend to inner wall surfaces of both side walls of the frame in the direction intersecting with the coolant flowing direction.

4. The heat exchanger according to claim 1, wherein the protrusion linearly extends in a direction perpendicular to the coolant flowing direction.

5. The heat exchanger according to claim 1, wherein the protrusion includes protrusions arranged side by side at predetermined intervals in the coolant flowing direction, and
    the fins are placed between the protrusions located adjacently in the coolant flowing direction.

6. The heat exchanger according to claim 5, wherein
    the heat exchanger is configured to cool a plurality of heat generating bodies arranged side by side in the coolant flowing direction,
    the first wall part includes a low-heat generation portion on which a heat generating body having a relatively small heat generation amount among the heat generating bodies is placed through the intervening member, and
    of the protrusions, a protrusion located upstream in the flow channel from and adjacent to the low-heat generation portion has a shorter protruding height protruding into the frame than a protruding height of other protrusion.

7. The heat exchanger according to claim 6, wherein a flow channel section of the coolant flow channel, the flow channel section including the low-heat generation portion, is deeper in flow channel depth than other flow channel sections are.

8. A semiconductor device including:
    the heat exchanger according to claim 1;
    a semiconductor element that is the heat generating body; and
    the intervening member welded to the first wall part of the frame and located between the semiconductor element and the first wall part.

9. A method for manufacturing a heat exchanger for cooling a heat generating body, the heat exchanger including a frame forming an outer casing and a fin member having a plurality of fins forming flow channels for coolant, the fin member being placed in the frame, the method comprising:
    a forming step of forming the frame including a first wall part to which an intervening member to be interposed between the frame and the heat generating body is welded; and
    an assembling step of assembling the heat exchanger by placing the fin member in the frame formed in the forming step,
    the forming step including drawing to form the protrusion protruding into the frame integral with the first wall part so that the protrusion has a U-shaped groove configuration having a U-shaped cross section that opens outward of the frame and linearly extending along a mounting surface on which the intervening member is to be placed, of the outer surface of the first wall part.

10. A method for manufacturing a semiconductor device comprising:
    the heat exchanger manufactured by the heat exchanger manufacturing method according to claim 9;
    a semiconductor element that is the heat generating body; and
    an intervening member to be interposed between the first wall part of the frame and the semiconductor element, the intervening member having a different linear expansion coefficient from a linear expansion coefficient of the frame, the method comprising:
    a welding step of placing the intervening member on the mounting surface of the first wall part of the frame and then welding the intervening member to the first wall part.

* * * * *

UNITED STATES PATENT AND TRADEMARK OFFICE
CERTIFICATE OF CORRECTION

PATENT NO. : 8,593,812 B2  
APPLICATION NO. : 13/259370  
DATED : November 26, 2013  
INVENTOR(S) : M. Morino et al.

It is certified that error appears in the above-identified patent and that said Letters Patent is hereby corrected as shown below:

In the Specification

At column 13, line 36, change "131dand 131e" to -- 131d and 131e --.

At column 16, line 57, change "Example 1" to -- Example 2 --.

At column 17, line 28, change "131kLow-heat" to -- 131k Low-heat --.

Signed and Sealed this
Thirteenth Day of May, 2014

Michelle K. Lee
*Deputy Director of the United States Patent and Trademark Office*

UNITED STATES PATENT AND TRADEMARK OFFICE
CERTIFICATE OF CORRECTION

PATENT NO.       : 8,593,812 B2
APPLICATION NO. : 13/259370
DATED            : November 26, 2013
INVENTOR(S)      : Morino et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 239 days.

Signed and Sealed this
Twenty-second Day of September, 2015

Michelle K. Lee
*Director of the United States Patent and Trademark Office*